(12) United States Patent
Ninomiya et al.

(10) Patent No.: US 7,919,374 B2
(45) Date of Patent: Apr. 5, 2011

(54) METHOD FOR MANUFACTURING A SEMICONDUCTOR DEVICE

(75) Inventors: Hitoshi Ninomiya, Kanagawa (JP); Yoshinao Miura, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 1 day.

(21) Appl. No.: 12/503,297

(22) Filed: Jul. 15, 2009

(65) Prior Publication Data

US 2009/0275180 A1 Nov. 5, 2009

Related U.S. Application Data

(62) Division of application No. 11/295,458, filed on Dec. 7, 2005, now abandoned.

(30) Foreign Application Priority Data

Dec. 10, 2004 (JP) ................................ 2004-358010

(51) Int. Cl.
*H01L 21/336* (2006.01)
*H01L 21/8234* (2006.01)
(52) U.S. Cl. .. 438/270; 438/237; 438/268; 257/E21.577
(58) Field of Classification Search .................. 438/193, 438/194, 237, 268, 270, 279, 290, E21.577
See application file for complete search history.

(56) References Cited

U.S. PATENT DOCUMENTS

| 6,600,193 | B2 | 7/2003 | Darwish |
| 6,657,256 | B2 | 12/2003 | Hshieh et al. |
| 2002/0070418 | A1 | 6/2002 | Kinzer et al. |
| 2002/0074596 | A1 | 6/2002 | Suzuki et al. |
| 2002/0187597 | A1 | 12/2002 | Ninomiya |
| 2002/0190313 | A1 | 12/2002 | Takaishi et al. |
| 2003/0219933 | A1 | 11/2003 | Yamauchi et al. |
| 2004/0016959 | A1* | 1/2004 | Yamaguchi et al. .......... 257/327 |
| 2004/0224455 | A1* | 11/2004 | Henson et al. ................ 438/200 |
| 2005/0212053 | A1* | 9/2005 | Miura et al. .................. 257/367 |
| 2006/0157813 | A1* | 7/2006 | Saito et al. ................... 257/498 |
| 2006/0244054 | A1* | 11/2006 | Kobayashi .................... 257/329 |

FOREIGN PATENT DOCUMENTS

| JP | 2002-184985 | 6/2002 |
| JP | 2002-368221 | 12/2002 |
| JP | 2002-373988 | 12/2002 |

* cited by examiner

*Primary Examiner* — Wael M Fahmy
*Assistant Examiner* — Sarah K Salerno
(74) *Attorney, Agent, or Firm* — Young & Thompson

(57) ABSTRACT

A conventional power MOSFET structure is difficult to improve a breakdown voltage of an element even using a super-junction structure. A power MOSFET according to an embodiment of the invention is a semiconductor device of a super-junction structure, including: a gate electrode filled in a trench formed on a semiconductor substrate; a gate wiring metal forming a surface layer; and a gate electrode plug connecting between the gate electrode and the gate wiring metal. Thus, a polysilicon layer necessary for the conventional typical power MOSFET is unnecessary. That is, column regions of an element active portion and an outer peripheral portion can be formed under the same conditions. As a result, it is possible to improve an element breakdown voltage as compared with the conventional one.

9 Claims, 3 Drawing Sheets

METHOD FOR MANUFACTURING A SEMICONDUCTOR DEVICE

BACKGROUND OF THE INVENTION

1. Field of the Invention

The present invention relates to a semiconductor device and a manufacturing method for the semiconductor device, and more specifically to a power MOSFET of a super-junction structure and a trench-gate structure.

2. Description of Related Art

In recent years, power components such as a power MOSFET (metal oxide semiconductor field effect transistor) have required a higher element breakdown voltage. A vertical power MOSFET has been widely used out as the power MOSFET. Japanese unexamined patent application publication No. 2002-368221 and Japanese unexamined patent application publication No. 2002-373988 disclose a conventional vertical power MOSFET. Up to now, the vertical power MOSFET adopts the trench-gate structure having a gate electrode formed in a trench for lowering an on-resistance super-junction structure or super-junction structure for realizing both the low on-resistance and high breakdown voltage. Further, Japanese unexamined patent application publication No. 2002-184985 discloses the technique of improving a breakdown voltage of the element by forming the super-junction structure even around the element. The super-junction structure is secured even around the element, so a depletion layer formed around the element expands to increase the breakdown voltage of the element.

FIGS. 3A and 3B show the element structure of a conventional typical vertical power MOSFET. In general, the vertical power MOSFET has a polysilicon layer 301 for forming a gate electrode on its periphery A heat treatment step is necessary for forming the gate electrode inclusive of the polysilicon layer 301. A column region 104 is generally formed through thermal diffusion. Thus, in the case where the column region 104 is formed before the formation of the gate electrode including the polysilicon layer 301, the heat treatment for the formation of the gate electrode including the polysilicon layer 301 induces the thermal diffusion of the column region 104. As a result, the element cannot be finely formed. In order to prevent the thermal diffusion of the column region 104 from proceeding, the column region 104 is formed after the formation of the gate electrode including the polysilicon layer 301. In this case, in the polysilicon layer 301 and its surrounding areas, ion implantation for forming the column region is hindered by the polysilicon layer 301. Hence, the column region 104 cannot be formed with sufficient depth. Therefore, the column region 104 is shallower under the polysilicon layer than other regions. That is, the uniform super-junction structure cannot be formed. The depth of the column region 104 in an element active portion is different from the depth of the column region 104 in the outer peripheral portions. As a result, the balance of charges between the element active portion and the outer peripheral portion is upset, making it difficult to improve the breakdown voltage of the element. Japanese unexamined patent application publication No. 2002-184985 discloses the structure where the column region has the uniform depth at the element active portion and the outer peripheral portion, but describes no structure for extracting a gate electrode.

SUMMARY OF THE INVENTION

A semiconductor device having a super-junction structure according to an aspect of the invention includes: a gate electrode filled in a trench formed on a semiconductor substrate; a gate wiring metal forming a surface layer; and a gate electrode plug connecting between the gate electrode and the gate wiring metal.

The power MOSFET according to the present invention is thus structured, so it is unnecessary to form the polysilicon layer necessary for the conventional typical power MOSFET. That is, the column region can be formed under the same conditions at the element active portion and the outer peripheral portion. Consequently, a breakdown voltage of the element can be made higher than the conventional one.

BRIEF DESCRIPTION OF TEE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1A:
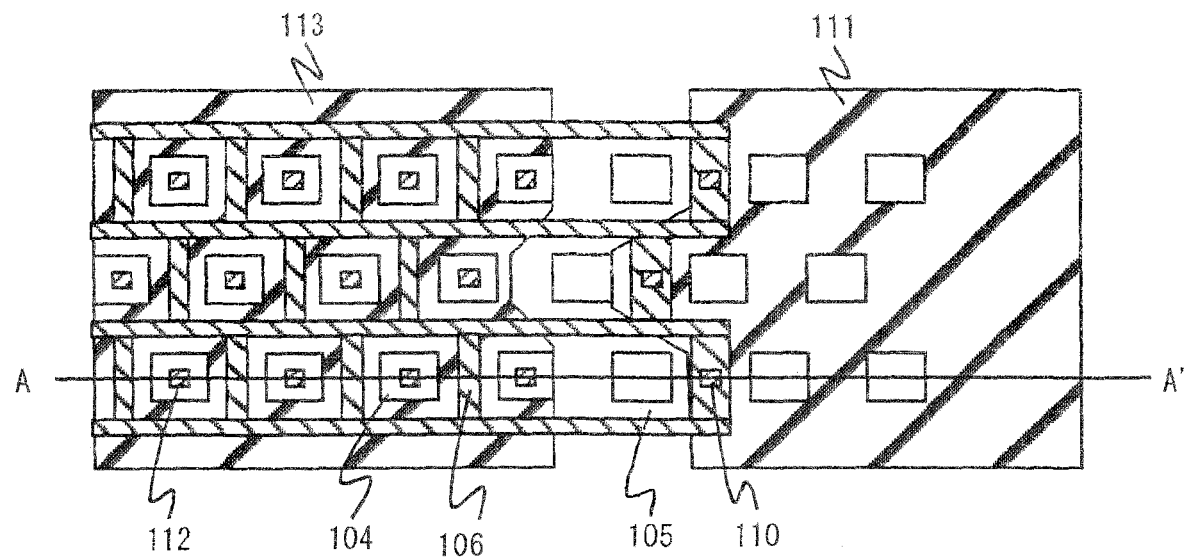
FIG. 1A is a top view showing a layout of a power MOSFET according to a first embodiment of the present invention.
Figure 1B:
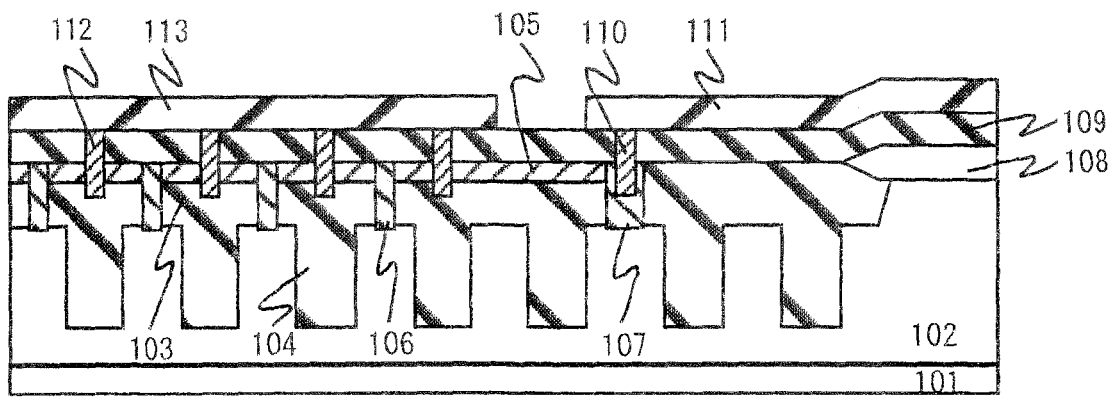
FIG. 1B is a sectional view showing the structure of the power MOSFET according to the first embodiment, of the present invention.

FIGS. 1A and 1B show an element structure of a power MOSFET according to a first embodiment of the present invention The power MOSFET according to the first embodiment is a vertical power MOSFET. FIG. 1A is a top view showing a layout of the power MOSFET. FIG. 1B is a sectional view taken along the line A-A'. A semiconductor substrate 101 of FIG. 15 is an N+ type semiconductor substrate (of a first conductivity type) made of, for example, silicon. An epitaxial layer 102 is formed over the semiconductor substrate 101. The epitaxial layer 102 is an N– type semiconductor (of the first conductivity type), for example, which serves as a drain of the vertical power MOSFET together with the semiconductor substrate 101. A base region 103 is formed on the epitaxial layer 102. In base region 103 is a P-type semiconductor region (of a second conductivity type) containing boron, for example. In the base region, a channel formation region is formed near a gate electrode 106 upon the operation of the vertical power MOSFET. Further, P-type semiconductor regions are formed in a columnar form to define column regions 104. The column regions 104 are the P-type semiconductor regions containing boron, for example. The structure having the column regions formed in the epitaxial layer 102 is a super-junction structure.

A source region 105 is formed between the gate electrodes 106 above the base region 103. The source region 105 is an N+ type semiconductor region containing arsenic, for example, which serves as a source of the power MOSFET. A trench is formed at a depth beyond the source region 105 and the base region 103 on the semiconductor substrate 10. A gate oxide film (not shown) is formed to cover the inner surface of the trench. Further, the gate electrode 106 is filled in the trench. The gate electrode 106 is formed of, for example, polysilicon and substantially fills the opening of the trench. The structure having the gate electrode filled in the trench formed on the semiconductor substrate is a trench-gate structure. A given gate electrode out of the gate electrodes formed on the semiconductor substrate 101 constitutes a gate electrode extraction portion 107. The gate electrode of the gate electrode extraction portion 107 is formed with a larger width than the other gate electrodes 106 for the connection with a gate electrode plug 110 as mentioned below.

A LOCOS (local oxidation of silicon) region 108 is formed in a predetermined region on the epitaxial layer 102.

As shown in the layout of the power MOSFET as viewed from the above in FIG. 1A, the gate electrodes are formed into a substantially rectangular shape to form island-like element active portions. Formed in the island-like active portion are the base region 103, the column region 104, the source region 105, and a source electrode plug 112. The semiconductor device of this embodiment has the plural island-like element active portions arranged in line. The base region 103 and the column region 104 are formed outside of the element active portions. Further, the LOCOS regions are selectively formed for element isolation.

An interlayer insulation layer 109 is formed throughout the entire upper surface of the semiconductor substrate 101 including the source region 105 the base region 103, and the LOCOS regions 108. The interlayer insulation layer 109 is formed of, for example, BPSG (boron doped phospho-silicate glass).

The interlayer insulation layer 109 has plural contact holes. The contact holes may be divided into two types: a gate contact hole formed above the gate electrode extraction portion 107 and a source contact hole formed above the source region 105. The gate contact hole passes through the interlayer insulating layer 109 on the gate electrode extraction portion 107 and the gate electrode extraction portion 107 is exposed on the surface. The source contact hole passes through the interlayer insulating layer 109 and the source region 105. The base region 105 is exposed on the surface.

Conductive plugs formed of a conductor (tungsten or titanium) fill in the gate contact hole and source contact hole. The conductive plugs filled in the gate contact hole and source contact hole are referred to as the gate electrode plug 110 and the source electrode plug 112 respectively.

A gate wiring metal 111 is formed on the gate electrode plug 110 and the interlayer insulating layer 109. The gate wiring metal 111 is formed by patterning a conductive layer such as an aluminum layer into a given shape. The gate wiring metal 111 is connected with the gate terminal of the power MOSFET.

A source wiring metal 113 is formed on the source electrode plug 112 and the interlayer insulating layer 109. The source wiring metal 113 is formed by patterning a conductive layer such as an aluminum layer into a predetermined shape. The source wiring metal 113 is connected with a source terminal of the power MOSFET.

An operation of the power MOSFET of the first embodiment is described. First, a description is give of the case where a voltage difference between the gate electrode 106 and the source region 105 of the power MOSFET is not higher than a threshold voltage of the power MOSFET, that is, the power MOSFET is turned off. Since the power MOSFET is turned off, there is a large voltage difference between the source region 105 and a drift region (epitaxial layer 102).

The voltage difference between the gate electrode 106 and the source region 105 is small, so a depletion layer (positive field) is formed at the junction between the drift region 102 and the base region 103. Further, the depletion layer is also formed at the junction between the drift region 102 and the column region 104. The column region 104 is defined by forming the P-type semiconductor into a deep columnar structure. Hence, the depletion layer is spread throughout the drift region 102 and the column region 104. In the power MOSFET, charges are hindered from moving in the source region 105 and the drift region 102 due to the depletion layer, so no current flows to turn off the power MOSFET.

In addition, the column region 104 of the element active portion has the same depth as that of the column region 104 of the outer peripheral portion, and thus, charges are kept in balance between the element active portion and the outer peripheral portion. That is, the depletion layer of uniform strength is formed at the element active portion and the outer peripheral portion.

Next, a description is given of the case where the voltage difference between the gate electrode 106 and the source region 105 of the power MOSFET is not less than the threshold voltage of the power MOSFET, that is, the power MOSFET is turned on. At this time, the power MOSFET is turned on, so the voltage difference between the source region 105 and the drift region 102 is small.

Since the high voltage is applied to the gate electrode 106, a channel (negative field) is formed at the junction between the gate electrode 106 and the base region 103. In the power MOSFET, charges flow between the source region 103 and the drift region 102 due to the channel, so the current flows to turn on the power MOSFET.

In the structure of the conventional power MOSFET, a polysilicon layer should be formed for the gate electrode. Therefore, at the time of forming the column region 104, ions necessary for forming the column region 104 cannot be implanted up to a sufficient depth in inverse proportion to the thickness of the polysilicon layer. As a result, the column region 104 of the outer peripheral portion is shallower than the column region 104 of the element active portion. That is, a uniform super-junction structure cannot be achieved. As a result, the balance of charges between the element active portion and the outer peripheral portion is unset. That is, the thickness 14 not uniform in the depletion layer, so the element breaks down in the thin portion of the depletion layer. This makes it difficult to improve the breakdown voltage of the power MOSFET.

However, in the power MOSFET of this embodiment, the gate electrode 106 is connected with the gate wiring metal 111 through the gate electrode plug 110. Hence, the power MOSFET of this embodiment dispenses with the polysilicon layer, which means that there is no thickness difference due to the polysilicon layer at the time of forming the column regions 104. Accordingly, the column region 104 of the element active portion has the same depth as that of the column region 104 of the outer peripheral portion. Since the column region 104 of the element active portion has the same depth as that of the column region 104 of the outer peripheral portion, charges are kept in balance between the element active portion and the outer peripheral portion. Thus, the depletion layer is spread with uniform thickness in the element active portion and the outer peripheral portion, so the depletion layer is uniform in thickness. In other words, the uniform depletion layer can be formed with a large thickness, so the breakdown voltage of the element improves. As a result, it is possible to improve the breakdown voltage of the power MOSFET.

According to the structure of the power MOSFET of the first embodiment, the element breakdown Voltage of the power MOSFET having the super-junction structure can be improved.

Second Embodiment

Figure 2A:
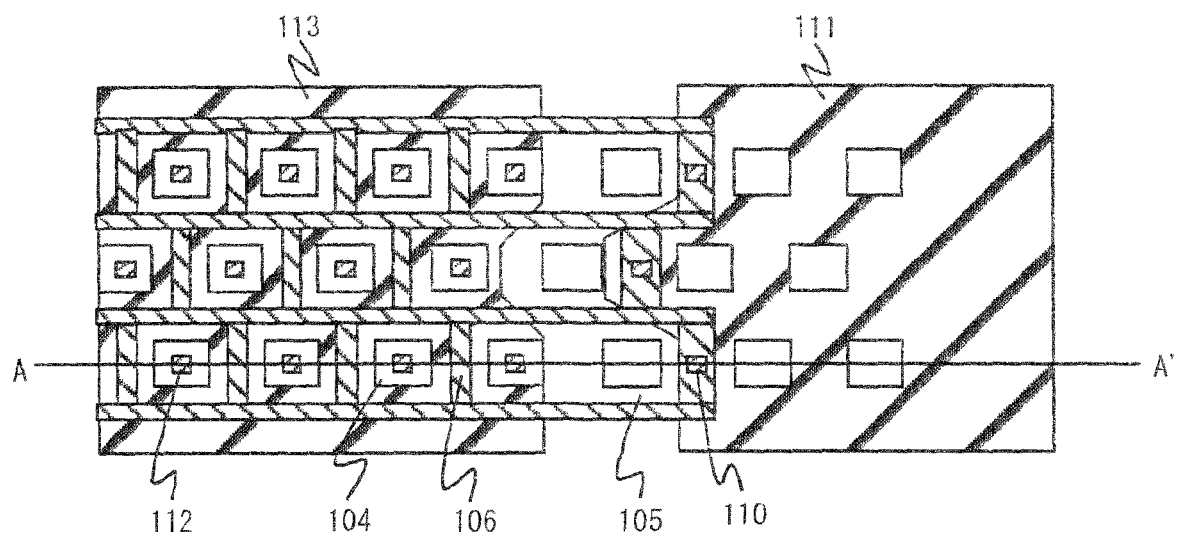
FIG. 2A is a top view showing a layout of a power MOSFET according to a second embodiment of the present invention.
Figure 2B:
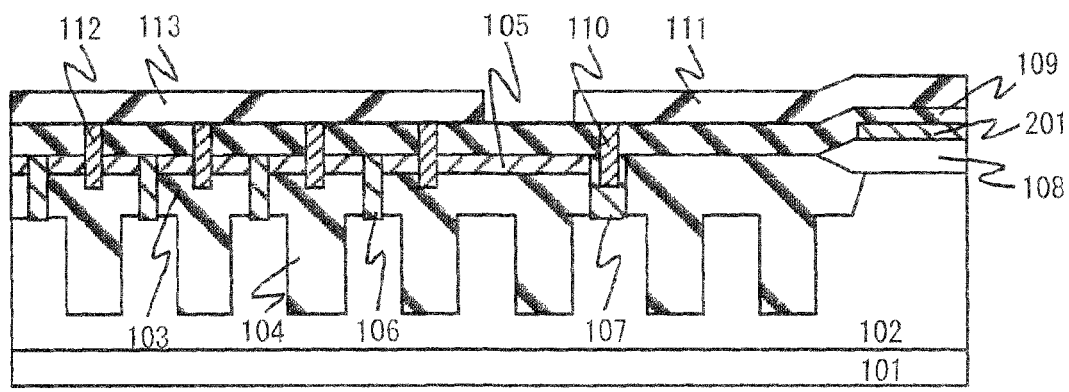
FIG. 2B is a sectional view showing the structure of the power MOSFET according to the second embodiment of the present invention.
Figure 3A:
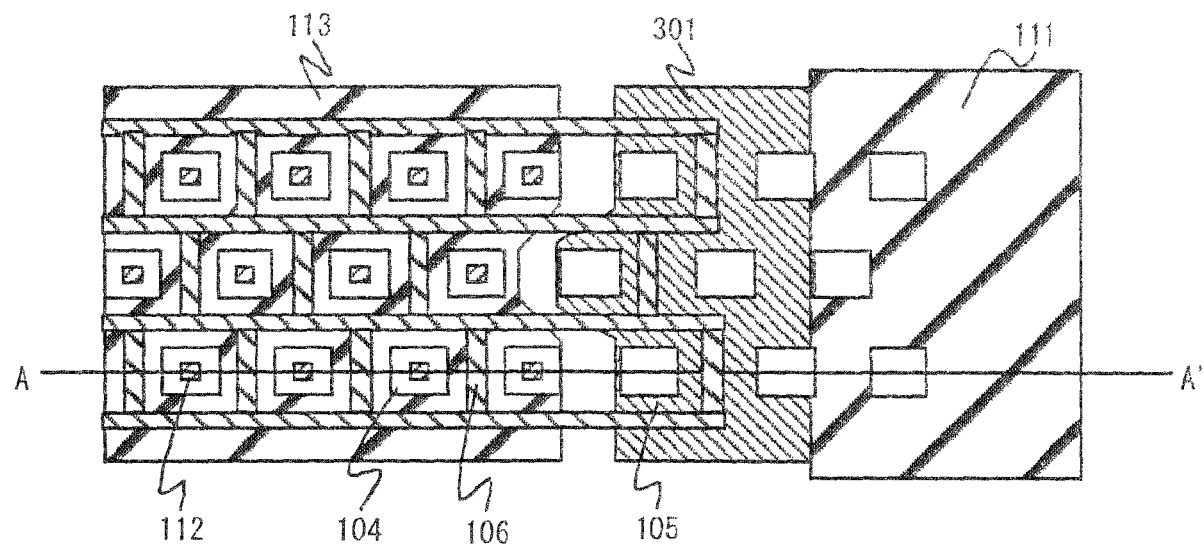
FIG. 3A is a top view showing a layout of a conventional typical power MOSFET.
Figure 3B:
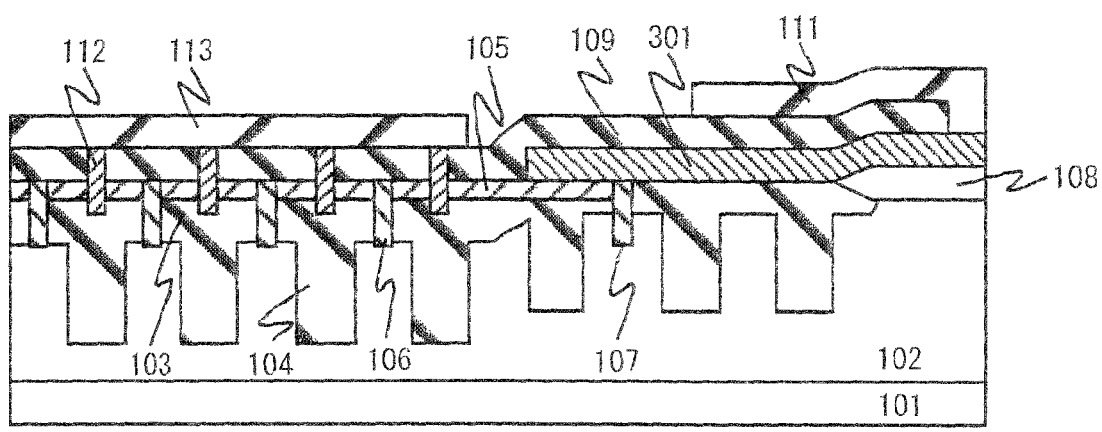
FIG. 3B is a sectional view showing the structure of the conventional typical power MOSFET.

FIGS. 2A and 2B show the structure of a power MOSFET according to a second embodiment of the present invention. The power MOSFET of the second embodiment is a vertical power MOSFET. FIG. 2A is a top view showing the layout of the power MOSFET according to the second embodiment. Further, FIG. 2B is a sectional view taken along the line A-A' of FIG. 2A. As apparent from the sectional structure of FIG. 2B, the structure of the power MOSFET of the second embodiment is basically the same as that of the first embodiment. The power MOSFET according to the first embodiment differs from the power MOSFET according to the second embodiment only in terms of the polysilicon layer 201 between the LOCOS region 108 and the Interlayer insulating film 100. The power MOSFET of the second embodiment has a polysilicon layer 201 formed between the LOCOS region 108 and the interlayer insulating film 109, while the power MOSFET of the first embodiment does not have the polysilicon layer 201. The polysilicon layer 201 forms a cathode region of a gate protective Zener diode formed on the interlayer insulating film.

The operation of the power MOSFET is described according to the second embodiment The structure of the power MOSFET is basically the same as that of the first embodiment. Therefore, the transistor operation of the power MOSFET of the second embodiment is the same as that of the power MOSFET of the first embodiment.

The polysilicon layer 201 formed only in the power MOSFET of the second embodiment forms a cathode region of the gate protective Zener diode between the gate terminal and the source terminal. That is, when abnormal voltage or current is applied/supplied between the gate terminal and the source terminal of the power MOSFET owing to the electrostatic discharge, the gate protective Zener diode functions to keep the voltage difference between the gate and the source from reaching or exceeding the predetermined voltage. In addition, upon the electrostatic discharge, current as well as a voltage is applied to the gate terminal. The gate protective Zener diode also functions as a bypass circuit for the circuit. In other words, the gate protective Zener diode prevents supply of an excessive voltage or current to the gate terminal so as not to break the gate terminal.

According to the power MOSFET of the second embodiment, the breakdown voltage can be increased similar to the power MOSFET of the first embodiment. In addition, the polysilicon layer 201 can be formed between the LOCOS region 108 and the interlayer insulating film 109 of the element, so the gate protective Zener diode can be manufactured concurrently with the element. Thus, the element resistance to the abnormal input to the gate terminal can be obtained.

Further, the polysilicon region 201 is formed of the same polysilicon as the gate electrode 106, and thus can be formed in the same step as the gate electrode 106.

The present invention is not limited to the above embodiments but allows various modifications. For example, the gate electrode can be extracted from an extraction portion at plural portions of the gate electrode of the element active portion.

It is apparent that the present invention is not limited to the above embodiment that may be modified and changed without departing from the scope and spirit of the invention.

What is claimed is:

1. A manufacturing method for a semiconductor device, comprising:
    forming a semiconductor layer of a first conductivity type on a semiconductor substrate the semiconductor layer including an element active portion and a peripheral portion that is formed in an outer periphery of the element active portion;
    forming a first trench and a second trench which are mutually connected in the semiconductor layer, the first trench being formed in the element active portion and the second trench being formed in the peripheral portion;
    forming a gate electrode in the first trench and a gate electrode extraction portion in the second trench, the gate electrode and the gate electrode extraction portion being mutually connected;
    forming a first column region of a second conductivity type in the element active portion in the semiconductor layer and a second column region of the second conductivity type in the peripheral portion in the semiconductor layer after forming the gate electrode in the first trench and the gate electrode extraction portion in the second trench, each of the first and second column regions having a columnar structure that is formed at a position deeper than the first and second trenches;
    forming an interlayer insulating film over the semiconductor layer, the gate electrode and the gate electrode extraction portion;
    forming a contact hole passing through the interlayer insulating film and protecting into the gate electrode extraction portion;
    forming a gate electrode plug using a conductor filled in the contact hole; and
    forming a gate wiring metal connected with the gate electrode plug over the interlayer insulating film.

2. The manufacturing method for a semiconductor device according to claim 1, wherein the gate electrode and the gate electrode extraction portion are formed from a polysilicon layer.

3. The manufacturing method for a semiconductor device according to claim 1, wherein the gate electrode and the gate electrode extraction portion have substantially a same depth as one another.

4. The manufacturing method for a semiconductor device according to claim 1, wherein a portion of the gate electrode extraction portion is formed with a larger width than a width of the gate electrode.

5. The manufacturing method for a semiconductor device according to claim 1, wherein the first column region and the second column region have substantially a same depth as one another.

6. The manufacturing method for a semiconductor device according to claim 1, wherein the contact hole is defined as a first contact hole, the semiconductor device further comprising;

forming a base region of the second conductivity type in an upper portion of the semiconductor layer; and forming a source region of the first conductivity type in an upper portion of the base region, wherein the step of forming a contact hole further comprises forming a second contact hole passing through the interlayer insulating film and the source region and projecting into the base region, the step of forming a gate electrode plug further comprises forming a source electrode plug filled in the second contact hole; and the step of forming a gate wiring metal further comprises forming a source wiring metal connected with the source electrode plug over the interlayer insulating film.

7. The manufacturing method for a semiconductor device according to claim 6, wherein the first contact hole and the second contact hole have substantially a same depth as one another.

8. The manufacturing method for a semiconductor device according to claim 1, further comprising:

forming a zener diode coupled between the gate wiring metal and the source wiring metal.

9. The manufacturing method for a semiconductor device according to claim 8, wherein the zener diode is formed from the polysilicon layer from which the gate electrode and the gate electrode extraction portion are formed.

* * * * *